United States Patent [19]

Shen

[11] Patent Number: 4,591,745

[45] Date of Patent: May 27, 1986

[54] POWER-ON RESET PULSE GENERATOR

[75] Inventor: Shannon N. Shen, Trumbull, Conn.

[73] Assignee: ITT Corporation, New York, N.Y.

[21] Appl. No.: 571,028

[22] Filed: Jan. 16, 1984

[51] Int. Cl.[4] .................. H03K 17/22; H03K 17/20; H03K 17/687; H03K 5/153

[52] U.S. Cl. ................................ 307/592; 307/594; 307/597

[58] Field of Search .................. 307/200 B, 592, 593, 307/594, 596, 597, 603, 605, 296 R, 297

[56] References Cited

U.S. PATENT DOCUMENTS

| | | | |
|---|---|---|---|
| 3,895,239 | 7/1975 | Alaspa | 307/594 |
| 4,140,930 | 2/1979 | Tanaka | 307/594 X |
| 4,260,907 | 4/1981 | Winebarger | 307/592 X |
| 4,307,306 | 12/1981 | Kucharewski | 307/592 X |
| 4,365,174 | 12/1982 | Kucharewski | 307/593 X |
| 4,385,245 | 5/1983 | Ulmer | 307/594 |
| 4,405,871 | 9/1983 | Buurma et al. | 307/594 |
| 4,419,596 | 12/1983 | Kikuchi | 307/594 X |
| 4,533,837 | 8/1985 | Tanaka et al. | 307/594 X |

FOREIGN PATENT DOCUMENTS 0035345 9/1981 European Pat. Off. ............ 307/594

Primary Examiner—Stanley D. Miller
Assistant Examiner—David R. Bertelson
Attorney, Agent, or Firm—Peter C. Van Der Sluys; Robert A. Hays

[57] ABSTRACT

A circuit for generating a pulse is disclosed for resetting certain multi-state elements of an electronic system after the power supply of the system has been activated and said elements have settled. The circuit is composed of an R-C network and a latch. The latch is activated by the power supply and it sets its output to a preselected state. The latch switches to a second state after a capacitor of the RC network is charged to a preselected level. The output of the latch is used to derive the reset signal. The reset signal may be delayed by a delay circuit and amplified and buffered or conditioned by an amplifying stage. The circuit is comprised of elements which may be produced by IC techniques such as CMOS so that it may be implemented on a single IC chip.

14 Claims, 6 Drawing Figures

POWER-ON RESET PULSE GENERATOR

BACKGROUND OF THE INVENTION

1. Field of Invention

This invention pertains to a circuit for generating a reset pulse after a power supply for an electronic system has been energized, and more particularly to a miniaturized circuit which could be incorporated into a large-scale integration (LSI)-type chip.

2. Description of the Prior Art

In many electronic circuits, certain components are used which can have two or more stable states. For example, digital circuits often comprise flip-flops, latches and counters. These types of components must be set to an initial or reset state prior to their normal operation every time the circuit is energized. Typically one or more circuits are energized from a single power supply. However as a power supply is activated, its output rises in an unpredictable manner with frequent fluctuations prior to reaching a final nominal steady state value. This is especially the case with switched power supplies in which oscillators and SCR's are used to convert a (usually high) D.C. or A.C. voltage and a (usually low) D.C. voltage. Because of this initial variation in the power supply output it is very difficult to insure that the above-mentioned multistate components are in a particular state after the power supply output has stabilized. Therefore an initializing, or a reset pulse is needed to set said components to the desired states. Normally the circuit used to generate this reset pulse is activated only once, for each power-up operation, and is left inactivated at all other times. It has been found that the reset pulse must have a duration, which depending on different power supplies ranges from microseconds to seconds.

In order to conserve space, and power and increase the operational speed of the electronic circuits, these circuits have been miniaturized by using well-known I.C. techniques such as CMOS. However reset pulse-generating circuits traditionally comprised passive elements such as resistors and capacitors which cannot be implemented on CMOS IC and therefore must be mounted externally.

OBJECTIVES AND SUMMARY OF THE INVENTION

In view of the above, an objective of this invention is to provide a reset pulse generating circuit which can be produced by usual techniques as part of a CMOS IC.

A further objective is to provide a circuit which can be incorporated in an IC chip together with other elements of an electronic system.

A further objective is to provide a circuit which can be modified to produce a pulse ranging from microseconds to seconds in duration. Other objectives and advantages of the invention shall become apparent in the following description.

As previously mentioned, the purpose of the reset pulse is to set certain circuit elements to predetermined states after the output of the power supply has settled. The duration of the pulse depends on the rise time of the power supply output. If this rise is very slow or it fluctuates so that it reaches the activating level of some circuit elements, such as a differential flip-flop, after a relatively long rise time, the reset pulse must also be long in order to insure that it has been applied to the circuit elements after their activation. In some cases the reset pulses must have a duration of a second or more. However, traditionally reset pulses have been derived from RC networks having appropriate time constants. In order to achieve the time constants necessary for the present application, the resistance and capacitance of the network must be in the order of megaohms and microfarads respectively. It is very difficult to obtain such elements on an integrated circuit (IC) chip. Therefore in this invention voltage-dependent elements such as FET's are used instead of the resistor. These elements have a high enough resistance so that the capacitor C may be reduced to the picofarad range. For very long time constants another non-linear element such as a diode is used to increase the resistance of the RC network.

The circuit also includes a latching means which is activated at an early stage of the power supply output rise and reset by the RC network.

The latching means is designed so that its output is either at first or at second value, thus eliminating the possibility of indeterminate states. It also provides amplification of the RC network output. Finally the latching means is also used as a memory means to insure that only one reset pulse is produced, every time the power supply is turned on and that fluctuations in the power supply output do not result in further reset pulses.

The output of the latching means is fed to delay circuit. This circuit is provided to allow time for the preselected components to be activated and stabilized before the reset pulse is applied.

The output of the delay circuit is amplified and buffered or conditioned by an amplifying circuit to produce a reset pulse with sharp, well-defined leading and trailing edges.

DETAILED DESCRIPTION OF THE INVENTION

Figure 1:
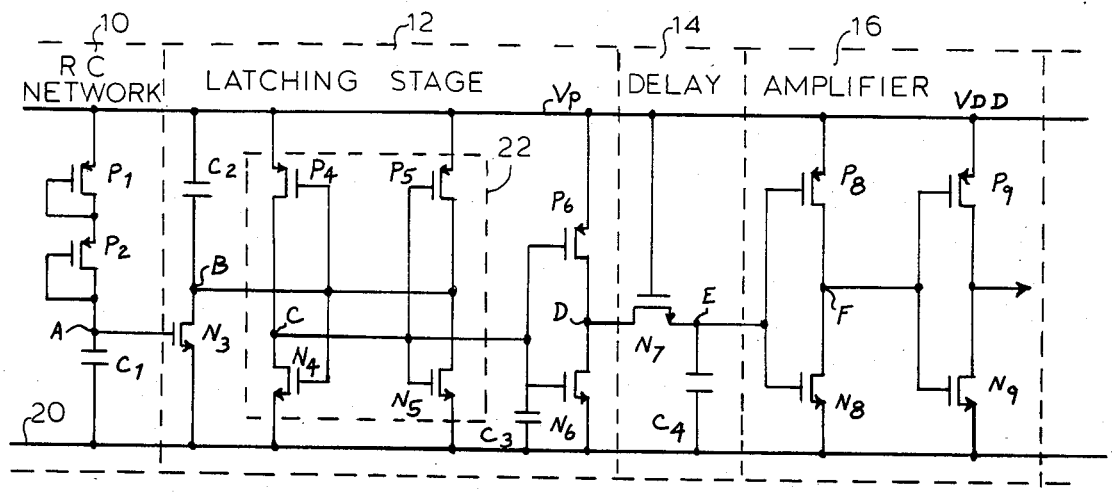
FIG. 1 shows the preferred embodiments of the invention.

As shown in FIG. 1, the reset pulse generating circuit comprises four stages: an RC network 10, a latching stage 12, a delay stage 14 and an amplifier stage 16. Advantageously, the circuit comprises only MOSFET's and capacitors so that it can be formed on a single IC chip by using CMOS or other similar techniques. It is well known the MOSFET's can be made either as a P-MOS or as an N-MOS transistor. For the sake of clarity all the P and N-MOS FET's are identified in the figures by the letters P or N followed by a numeral. Furthermore certain FET's are preferably formed on the chip as complementary pairs and coupled to create an inverters. The respective P- and N-MOS FET's of each complementary pair have been assigned the same numeral.

In the embodiment of FIG. 1, the RC network 10 comprises a capacitor $C_1$ and two P-MOS transistors $P_1$ and $P_2$. The capacitor has a value of 4pF. The equivalent resistance of $P_1$ and $P_2$ is dependent on the voltage between the respective drains and sources of the transistors $P_1$ and $P_2$. Capacitor $C_1$ and transistor $P_1$ and $P_2$ are in series between positive bus 20, and ground bus 18 as shown.

Figure 2:
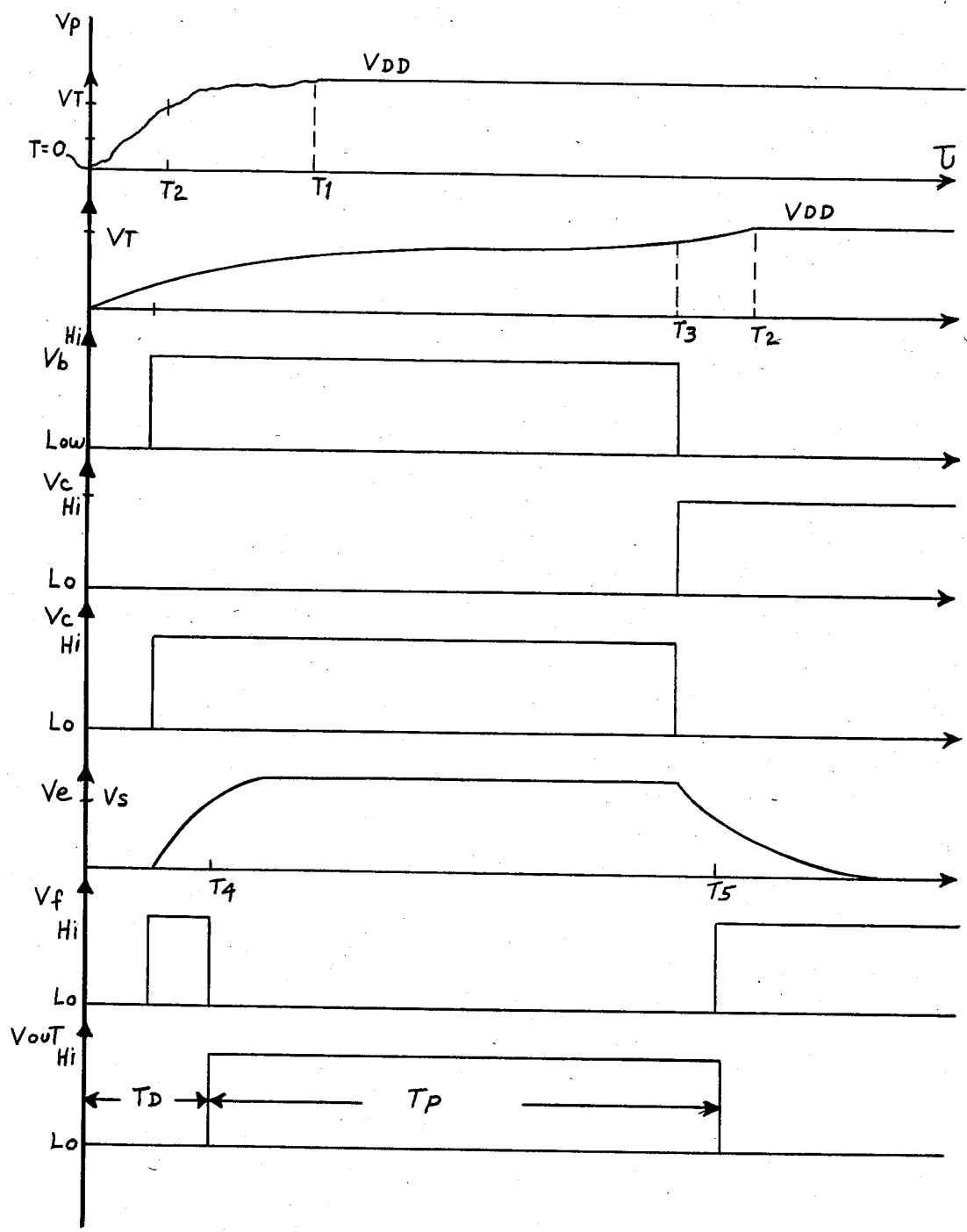
FIG. 2 shows the output of power supplied and the voltages of selected modes within the circuit as well as its output.

The two buses are connected to the output of a power supply (not shown) so that when the power supply is activated at time $t=0$ the voltage across them, $V_p$ rises from 0 to a final, nominal value $V_{DD}$ as shown on FIG. 2.

As $V_p$ rises, transistors $P_1$ and $P_2$ start conducting and the voltage across the capacitor, and node A starts rising also. The voltage profiles at different nodes of the pulse generating circuit are also shown on FIG. 2. The voltage drops across $P_1$ and $P_2$ depend on the current and back bias of the transistors. If the transistors $P_1$ and $P_2$ are provided with a channel width-per-length of 6/20 and 6/70 respectively then the voltage drops across them ranges from 1 to 3 volts. Therefore Va does not have any appreciable value until $V_p$ reaches at least 4 volts, independently of the rate of rise of $V_p$.

The latching stage 12 comprises three inverters, and an input transistor $N_3$ used to couple this stage to the RC network 10. The inverters consists of two complementary transistors connected in series as shown. The inverters consisting of $P_4$, $N_4$ and $P_5$, $N_5$ respectively are hooked up back-to-back to form a latch 22 with an input node B, and output node C. The transistors are formed with the following channel width-to-length ratios: $P_4$- 6/11, $N_4$- 12/5, $P_5$- 6/11, and $N_5$- 6/20. This unsymmetrical arrangement is provided to insure that when the power supply is activated the latch output is initially low. Therefore, as shown in FIG. 2, at $t=T_2$ the power supply output reaches a threshold value $V_p=V_t$ which activates the latching stage, at which point $V_b$ goes high and $V_c$ is low.

In order to make sure that the latch 22 powers-up to the above-defined state the input and output nodes B and C are also coupled respectively to the positive and ground buses 18 and 20 through capacitors $C_2$ and $C_3$ as shown. Preferably $C_2$ has a value of 0.5 pF while $C_3 = 1$pF.

The latching stage also comprises a third inverter consisting of complementary transistors $P_6$ and $N_6$. This third inverter is used to invert the output of the latch. Preferably $P_6$ and $N_6$ should have a width-to-length ratio of 6/5.

The delay stage is coupled to output node D of the third inverter, and it comprises a second RC network. The resistance of the network is provided by a transistor $N_7$ with its source connected in series with a capacitor $C_4$. The capacitor preferably has a value of 2pF while the transistor has a width-to-length channel ratio of 6/30.

The voltage across the capacitor $C_4$, i.e. the voltage $V_e$ at node E, is coupled to the amplifier stage 16. As shown in FIG. 1, the amplifier stage comprises two inverters having two complementary transistors, namely $P_8$, $N_8$ and $P_9$, $N_9$. The two inverters are connected in series, so that the output of the delay stage comprises the input of the first inverter ($P_8/N_8$) and the output the first inverter (node F) comprises the input of the second inverter ($P_9/N_9$). The output of the second inverter comprises the output of the whole pulse generating circuit. The width-to-length channel ratio of $P_8$ and $N_8$ is 6/5 and for $P_9$ and $N_9$, 24/5.

The operation of the circuit is obvious from the above description. As shown in FIG. 2, the output of a power supply activated at $t=0$ stabilizes at $t=T_1$. Sometimes before $T_1$, at $T_2$ said output reaches a value $V_t$ at which point the latching stage 12 is energized, node B goes high and node C stays low. The logic level of node C is inverted by inverter $P_6/N_6$ so that node D also goes high. As soon as $V_d$ goes high, capacitor $C_4$ starts charging through transistor $N_7$.

Initially inverter $P_8/N_8$ has a high output at node F ($V_f$) due to the low voltage across $C_4$. When the voltage across $C_4$ ($V_e$) reaches a threshold level $V_s$ (at $t=T_4$) the output of inverter $P_8/N_8$ (node F) goes low. This output is inverted by inverter $P_9/N_9$ so that at $t=T_4$ the output of the whole circuit goes high initializing the reset pulse.

Meanwhile the capacitor $C_1$ of RC network 10 has been charging up toward $V_{DD}$. When its voltage $V_a$ reaches a level $V_t$ (at $t=T_3$) transistor $N_3$ turns ON pulling node B to ground. The latch 22 immediately flips over so that its output $V_c$ goes high. Consequently the output $V_d$ of inverter $P_6/N_6$ goes low and stays low for as long as the power supply is ON.

When node D goes low transistor $N_7$ is turned off and capacitor $C_4$ starts discharging through $N_8$ as shown. When its voltage $V_e$ reaches $V_s$ (at $t=T_5$) transistor $N_8$ also turns off and the output of inverter $P_8/N_8$ (node F) goes high. This change causes the output of inverter $P_9/N_9$ to go low, terminating the reset pulse.

As shown in FIG. 2, the reset pulse goes on after a period $T_D$ to allow all preselected circuit elements to settle. $T_D$ is determined by the rate of rise of $V_p$ and the time constant of the delay stage 14. The period $T_p$ of the reset pulse is determined essentially by the time constant of the RC network 10.

Figure 3:
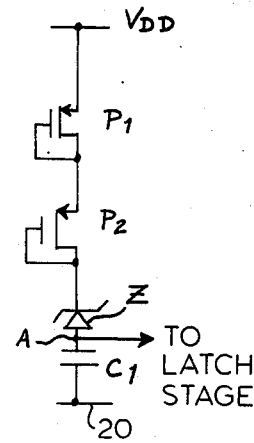
FIGS. 3, 4, and 5 show alternative embodiments of the RC network.

The circuit shown in FIG. 1 is suitable for reset pulses in the range of 1–10 microseconds. In order to increase the period of the pulse to miliseconds, another element with a much higher resistance can be used. One such element, as shown in FIG. 3, could be a zener diode Z which is connected in series with $C_1$ in a reverse-biased position. In this embodiment the transistors $P_1$ and $P_2$ are used to provide a voltage drop as described above. The capacitor is charged up by the leakage current passing through the zener diode. Due to the non-linear characteristics of this device its effective resistance is much larger than the resistance of the two transistors. The effective time constant of the capacitor and zener diode is in the milisecond range.

Figure 4:
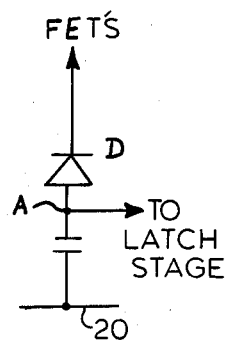

If a very long pulse of one second or more is required a reverse biased diode D may be used to charge the capacitor as shown in FIG. 4. The leakage current through this diode D is low enough to extend the reset period into minutes. Preferably diode D is made by forming a P-well and N-diffusion junction through readily available CMOS techniques.

Figure 5:
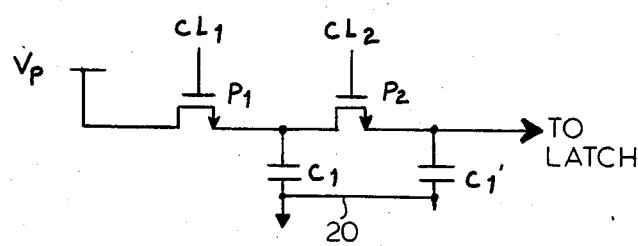

In certain applications a very precise control over the time constant of the RC network may be necessary. This may be accomplished, as shown in FIG. 5 by providing two transistor $P_1$ and $P_2$ in series, each transistor having its gate connected to clock siqnals $Cl_1$ and $Cl_2$ respectively, and its source to two switched capacitors $C_1$ and $C_1'$.

The clock signals are enabled as soon as power reaches the threshold value $V_p=V_T$ at $t=T_2$ and will be reset by the reset pulse. $Cl_1$ and $Cl_2$ are non-overlapping and 180° out of phase clocks. When $Cl_1$ is high, transistor $P_1$ conducts and $C_1$ is charged up to $V_p$, This charge is then redistributed between $C_1$ and $C_1'$ during the cycle when $Cl_2$ is high. During a complete clock period, an amount of charge $$\frac{C_1 C_1'}{C_1 + C_1''} V_p$$

is deposited on the $C_1'$ capacitor. As more is accumulated on the capacitor, the voltage increases until it is high enough to flip the latch 12. The time constant of this embodiment depends on the frequency of clocks $C1_1$ and $C1_2$ and the ratio of $C_1$ and $C_1'$ and is essentially independent of $V_p$.

As mentioned above, in order to insure that the latch 22 initially has a high output, its component transistors are unsymmetrical, and additional capacitors $C_2$ and $C_3$ have been added to corresponding nodes B and C.

Figure 6:
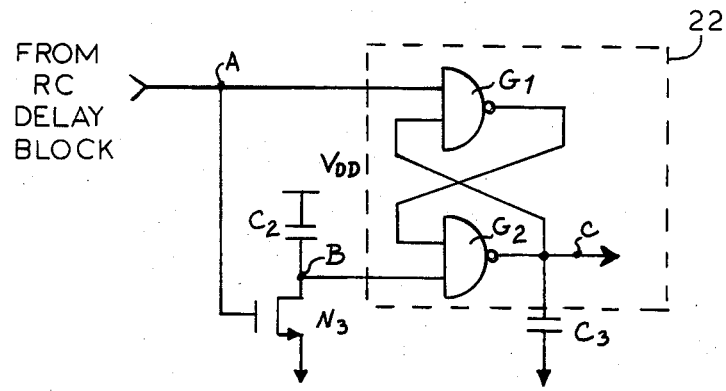
FIG. 6 shows an alternate embodiment of the latching stage.

A further degree of security is provided by the embodiment of FIG. 6 in which latch 22 comprises two NAND gates $G_1$ and $G_2$. The input of NAND gate $G_1$ comprises $V_p$ and the output of gate $G_2$, and the input of NAND gate $G_2$ consists of the output of $G_1$ and node B. Thus in effect gates $G_1$ and $G_2$ from a flip-flop. The output of the flip-flop (node C) is initially coupled to ground by capacitor $C_3$ thus insuring that initially node C is at it low state. Of course this embodiment requires more transistors (for implementing gates $G_1$ and $G_2$) than the embodiment of FIG. 1.

Obviously numerous additions and modifications could be made to the invention without departing from its scope as defined in the appended claims.

I claim:

1. A circuit for generating a pulse signal in response to the activation of a power supply; said circuit comprising:
   an RC network operatively connected to said power supply and defining a first time constant;
   latching means connected to said RC network to initiate a pulse in response to the activation of said power supply and to terminate said pulse in accordance to said first time constant, said RC network and said latching means being formed on a chip by an integrated circuit generating technique; and
   delay means, said delay means producing a delayed signal in response to said latching means output voltage level.

2. The circuit of claim 1 wherein said RC network comprises an FET and a capacitor in series, said FET being provided to charge up said capacitor when said power supply is activated.

3. The circuit of claim 2 wherein said latching means comprise two back-to-back inverters to form a bistable circuit and connected to produce a first output voltage level when said power supply is activated and a second output voltage level when said capacitor is charged up to a preselected level.

4. The circuit of claim 1 further comprising means for amplifying the delayed signal.

5. The circuit of claim 2 wherein said RC network further comprises a backbiased zener diode in series with said FET.

6. The circuit of claim 2 wherein said RC network further comprises a backbiased diode in series with said FET.

7. The circuit of claim 2 wherein said RC network comprises two switched capacitors each connected in series with an FET, each FET having a gate connected to a clock signal, one of said FET's also being connected to said power supply while the other FET provides the input to said latching means.

8. The circuit of claim 2 wherein said latching means comprises a flip-flop.

9. A circuit for generating a pulse signal in response to the activation of a power supply comprising
   a pair of buses connected to said power supply;
   an RC network comprising two FET's in series with a capacitor being connected across said buses;
   first and second inverters connected back-to-back to form a latch said latch having an input connected to said capacitor through a third FET, and an output connected to a third inverter, said third inverter having an output, said latch being biased to a first predetermined state when said buses are energized, said latch switching over to a second predetermined state when said third FET is turned on;
   delay means comprising a second capacitor and a fourth FET connected between said second capacitor and the output of said third inverter to produce a delayed signal; and
   amplifying means for amplifying and buffering said delayed signal;
   said RC network, inverters, delay means, and amplifying means being formed on a chip by integrated circuit generating means;
   whereby when a voltage is applied by said power supply on said buses, said latch initiates a reset signal on its output, while said first capacitor is charging through said two FET's until the capacitor reaches a predetermined level which energizes said third FET switching said latch to its second state thereby terminating said reset pulse, said reset pulse being delayed by said delay means and amplified by said amplifying means.

10. The circuit of claim 9 wherein said inverters comprise complementary P- and N-MOS transistors.

11. The circuit of claim 10 wherein the transistors of the inverters forming said latch are unsymmetrical to bias said latch toward said first predetermined state.

12. The circuit of claim 10 wherein said latch is biased by a third capacitor connected to its input and a fourth capacitor connected to its output.

13. The circuit of claim 11 wherein said latch is biased by a third capacitor connected to its input and a fourth capacitor connected to its output.

14. The circuit of claim 9 wherein said amplifying means comprises fourth and fifth inverters, each inverter comprising two complementary transistors.

* * * * *